United States Patent [19]

Izunome et al.

[11] Patent Number: 5,700,320
[45] Date of Patent: Dec. 23, 1997

[54] GROWTH OF SILICON SINGLE CRYSTAL HAVING UNIFORM IMPURITY DISTRIBUTION ALONG LENGTHWISE OR RADIAL DIRECTION

[75] Inventors: Koji Izunome, Ami-machi; Souroku Kawanishi, Tsukuba; Shinji Togawa, Tsukuba; Atsushi Ikari, Tsukuba; Hitoshi Sasaki, Omiya; Shigeyuki Kimura, Tsukuba, all of Japan

[73] Assignees: Research Development Corporation of Japan, Saitama-ken; Sumitomo Sitix Corporation, Hyogo-ken; Toshiba Ceramics Co., Ltd.; Nippon Steel Corporation, both of Tokyo; Komatsu Electronic Metals Co., Ltd., Kanagawa-ken; Mitsubishi Materials Corporation, Tokyo, all of Japan

[21] Appl. No.: 620,391

[22] Filed: Mar. 22, 1996

[30] Foreign Application Priority Data

Mar. 24, 1995 [JP] Japan ................... 7-091430
Mar. 24, 1995 [JP] Japan ................... 7-091431

[51] Int. Cl.$^6$ ................... C30B 15/04
[52] U.S. Cl. ................... 117/19; 117/15
[58] Field of Search ................... 117/13, 15, 19, 117/41, 928

[56] References Cited

U.S. PATENT DOCUMENTS 4,059,461 11/1977 Fan et al. ................... 117/9
5,392,729 2/1995 Kuramochi et al. ................... 117/20
5,423,283 6/1995 Seki ................... 117/928

*Primary Examiner*—Felisa Garrett
*Attorney, Agent, or Firm*—Webb Ziesenheim Bruening Logsdon Orkin & Hanson, P.C.

[57] ABSTRACT

When a B or P-doped Si single crystal is pulled up from a B or P-doped melt by the Czochralski method, an element such as Ga, Sb or In having the effect to reduce the heat expansion coefficient of said melt at a temperature near the melting point is added to said melt. The additive element stabilizes the temperature condition of crystal growth so as to control the generation of eddy flows just below the interface of crystal growth.

When a Ga or Sb-doped Si single crystal is pulled up from a Ga or Sb-doped melt, an element such as B or P having the effect to increase the heat expansion coefficient of said melt at a temperature near the melting point is added. The agitation of the melt just below the interface of crystal growth is accelerated by the addition of B or P, so as to assure the growth of a Si single crystal from the melt having impurity distribution made uniform along the radial direction.

Accordingly, a Si single crystal is formed having a uniform impurity distribution along its lengthwise or radial direction.

4 Claims, 4 Drawing Sheets direction of crystal grouwth (PRIOR ART)

RELIABILITY OF DENSITY OF Si MELT TO WHICH IMPURITY WAS ADDED

GROWTH OF SILICON SINGLE CRYSTAL HAVING UNIFORM IMPURITY DISTRIBUTION ALONG LENGTHWISE OR RADIAL DIRECTION

BACKGROUND OF THE INVENTION

The present invention relates to a method of pulling up a Si single crystal having uniform impurity distribution along its lengthwise or radial direction from a Si melt by the Czochralski method.

The Czochralski method is a representative method for the growth of a Si single crystal from a melt.

Czochralski method uses a crucible 2 located in a closed chamber 1 as shown in FIG. 1. The crucible 2 is supported by a support 3 so that the crucible 2 is capable of rotation and/or vertical motion. A heater 4 and a heat insulator 5 are concentrically disposed around the crucible 2, so as to hold the crucible at a temperature suitable for the growth of a Si single crystal.

A seed crystal 7 is located in contact with the melt 6, so as to grow a Si single crystal 8 having the crystalline orientation imitating that of the seed crystal 7. The seed crystal 7 is hung down through a wire 9 from a rotary winder 10 or a rigid pulling-up rod, and gradually pulled upwards in response to the degree of crystal growth. The crucible 2 is descended by the proper rotating motion of the support 3, too. The descending and rotating speed of the support 3 as well as the ascending and rotating speed of the seed crystal 7 are controlled in response to the growing speed of the Si single crystal 8 being pulled up from the melt 6.

Various kinds of impurities are added to the melt 6, to endow the Si single crystal 8 with a certain property according to needs. The motion of the melt at the interface of crystal growth is often varied in response to the kind of impurity.

Unstable solidification is likely to be formed at the interface of crystal growth, especially in the Si melt to which an impurity such as B or P is added as a dopant. The unstable solidification causes impurity non-uniformity with respect to the direction of crystal growth. We suppose the effect of the impurities on the unstable solidification as follows:

The B or P-doped melt has the effective coefficient of segregation fluctuated due to the microscopic deviation of crystal growth speed. The heat expansion coefficient of the melt is approximately $1.5 \times 10^{-3}/°C$. at a temperature near the melting point of the melt. That is, the heat expansion coefficient of the melt at the interface of crystal growth becomes locally bigger than that of the melt at the surroundings. As a result, the temperature of the melt changes with big fluctuations just below the interface of crystal growth due to turbulent flow, and the remelting phenomenon directly causing uneven impurity distribution occurs. The remelting unstabilizes the impurity distribution in the pulled-up Si single crystal and induces various crystallographic defects in the single crystal, too.

Impurity non-uniformity along a radial direction is likely to occur at the interface of crystal growth in a Ga or Sb-doped Si melt, too. We suppose the reason why the uneven impurity distribution in the Ga or Sb-doped melt occurs as follows:

Since the heat expansion coefficient of the melt is approximately $6.0 \times 10^{-6}/°C$. at a temperature near the melting point of the melt, the Ga or Sb-doped melt has the effective coefficient of segregation fluctuated due to the microscopic deviation of flow speed. As a result, the turbulent effect of Si melt dependent upon the heat expansion coefficient is reduced, the dopant is not sufficiently dispersed in the melt, and the impurity distribution becomes non-uniform along a radial direction just below the interface of crystal growth.

The impurity non-uniformity is held as such in the diffusion boundary layer which is formed just below the interface of crystal growth, and introduced into a single crystal pulled up from the melt. Consequently, the impurity distribution in the obtained single crystal becomes uniform along its radial direction, so as to reduce the quality of the obtained single crystal.

SUMMARY OF THE INVENTION

The present invention is accomplished to overcome the defects above-mentioned.

An object of the present invention is to obtain a Si single crystal having substantially uniform impurity distribution along the direction of crystal growth.

The other object of the present invention is to obtain a Si single crystal having substantially uniform impurity distribution uniform along its radial direction.

When a Si single crystal is pulled up from a B or P-doped Si melt by the Czochralski method according to the present invention, the element which has the effect to reduce the heat expansion coefficient at a temperature near the melting point of said melt is added to said melt. The element having the effect to reduce the heat expansion coefficient may be one or more selected from Ga, Sb and In.

When a Si single crystal is pulled up from a Ga or Sb-doped Si melt by the Czochralski method according to the present invention, the element which has the effect to increase the heat expansion coefficient of said melt at a temperature near the melting point is added to said melt. The element having the effect to increase the heat expansion coefficient may be B or P.

DETAILED DESCRIPTION OF THE PREFERRED EMBODIMENTS

Figure 1:
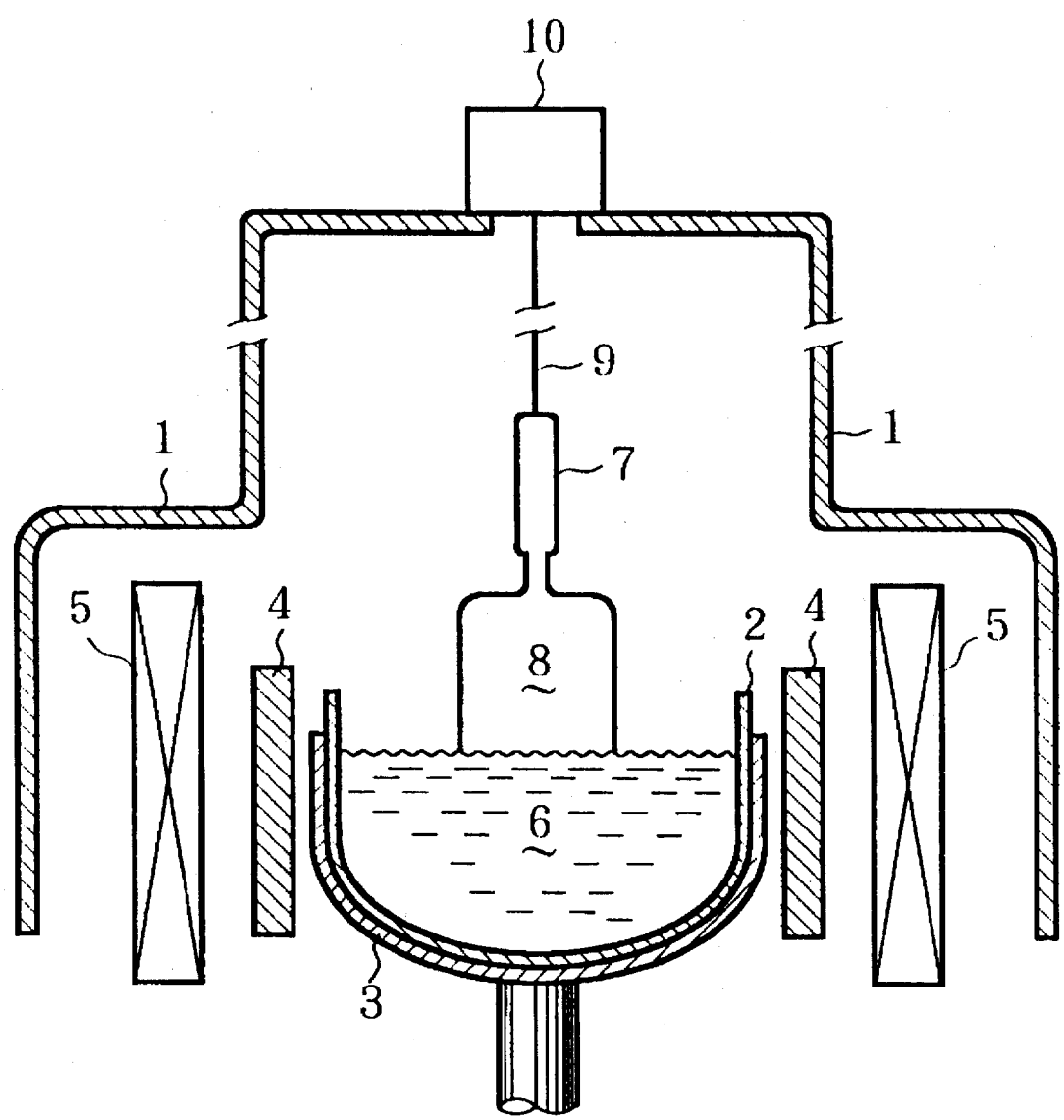
FIG. 1 (Prior Art) is a schematic view illustrating a device for pulling up a Si single crystal by the Czochralski method.

The impurity distribution along the direction of crystal growth is mainly affected by the magnitude of fluctuations in the temperature deviation of the Si melt just below the interface of crystal growth. The impurity distribution with respect to the direction of crystal growth is made substantially uniform by suppressing the temperature deviation just below the interface of crystal growth.

On the other hand, the impurity distribution along the radial direction of the single crystal pulled up from a Si melt is mainly derived from the impurity distribution of the melt just below the interface of crystal growth. Said impurity distribution is made substantially uniform by actively agitating the melt just below the interface of crystal growth.

We have researched and examined the Si melt properties from various points of view, and found that some additives effectively control the impurity distribution along the lengthwise or radial direction. That is, the additives Ga, Sb or In in the B or P-doped melt has the effect to reduce the heat expansion coefficient of the melt, while the additives B or P in the Ga or Sb-doped melt has the effect to increase the heat expansion coefficient of the melt. These elements, i.e. Ga, Sb, In, B and P belong to the same group, i.e. Group-III or IV, on Periodic Table.

According to our researches, it is found that the temperature deviation just below the interface of crystal growth is derived from the turbulent flow which are generated by locally deviating the heat expansion coefficient of the melt at a temperature near its melting point. When element having the effect to reduce the heat expansion coefficient is added to the melt, the local deviation of the heat expansion coefficient is suppressed so that laminar flow in the melt is assured even at the part just below the interface of crystal growth. As a result, a single crystal is grown up under a stabilized temperature condition which inhibits remelting. The Si single crystal obtained in this way is the high-quality product having impurity distribution made uniform along the direction of crystal growth.

The resistance of the B or P-doped melt is preferably conditioned to 0.001–10 $\Omega$.cm after the addition of the element such as Ga, Sb and/or preferably at the ratio of $1\times10^{18}$–$5\times10^{20}$ atoms/cm$^3$, accounting evaporation loss on the surface of the melt during pulling-up operation.

The impurity distribution along the radial direction of a Si single crystal is made uniform by actively agitating the melt just below the interface of crystal growth. We have found that the agitation of the Ga or Sb-doped melt just below the interface of crystal growth is accelereated by adding the element B or P. These elements have the effect to increase the heat expansion coefficient of the melt.

The melt to which the element B or P is added has the feature that its heat expansion coefficient becomes larger locally at a part just below the interface of crystal growth held at a temperature near the melting point. That is, the difference between the heat expansion coefficient of the melt just below the interface of crystal growth and that of the melt at the surroundings becomes bigger, so as to accelerate the circulation of the melt. As a result, the melt just below the interface of crystal growth is sufficiently agitated, and the impurity distribution is made uniform along the radial direction. Therefore, a Si single crystal pulled up the melt conditioned in this way has even impurity distribution along the radial direction.

EXAMPLE

Example 1

A B or P-doped melt source 5 kg was prepared by adding B or P at the ratio of $1\times10^{15}$ atoms/cm$^3$. After Ga or Sb was further added to the Si source at the ratio of 1.0 atomic %, the Si source was melted in a crucible. The resultant Si melt was held in a chamber filled with Ar gas until the initiation of pulling-up operation.

Figure 2:
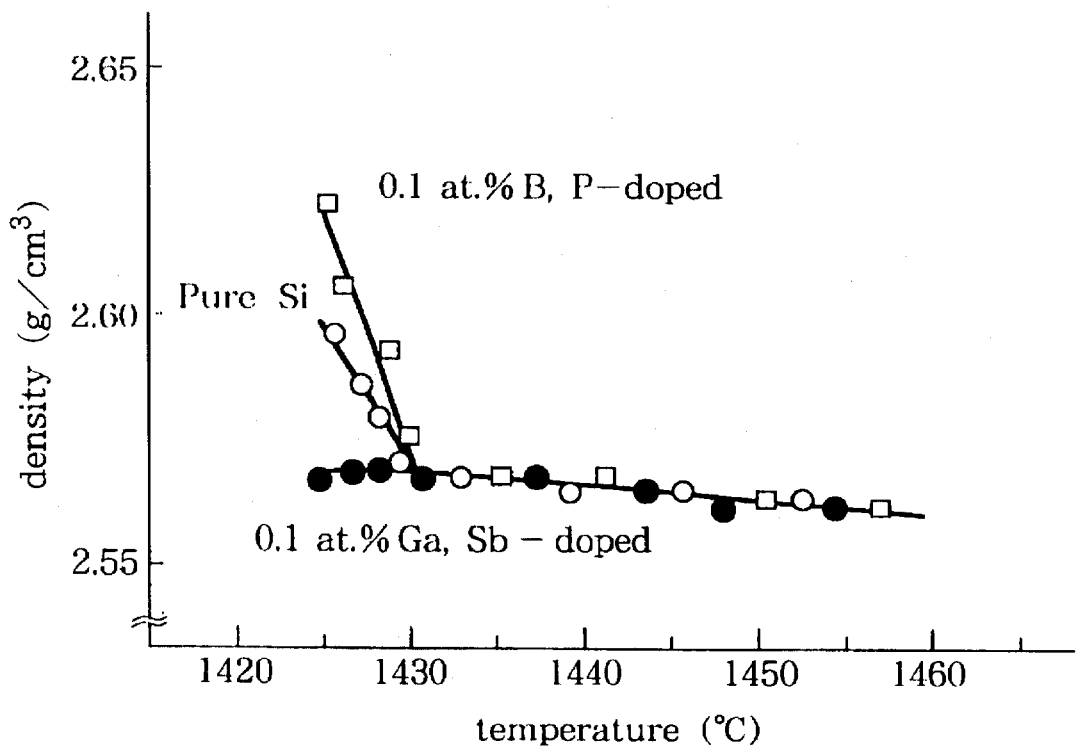
FIG. 2 is a graph showing the relationships of density with the temperature of the Si melt to which various impurities were added.

The B or P-doped melt had the dependence of melt density on the temperature, as shown in FIG. 2. From the results in FIG. 2, the heat expansion of said melt is estimated of approximately $1.5\times10^{-3}/°C$. in the temperature range of from its melting point to 1430° C. It is noted that the density of the melt was abruptly deviated especially in said temperature range. The abrupt deviation means that the melt flow was in unstable state.

The deviation of density in relation with the temperature of the melt was moderated by the addition of Ga, Sb or In, as shown in FIG. 2. According to our researches, the heat expansion coefficient of the melt to which Ga or Sb was further added is estimated of approximately $6.0\times10^{-6}/°C$. in the temperature range of from the melting point to 1430° C.

By comparing this heat expansion coefficient with the former one, it is presumed that the melt has smaller heat expansion coefficient compared with the B or P-doped melt, and that the abrupt fluctuations in density are suppressed.

Figure 3:
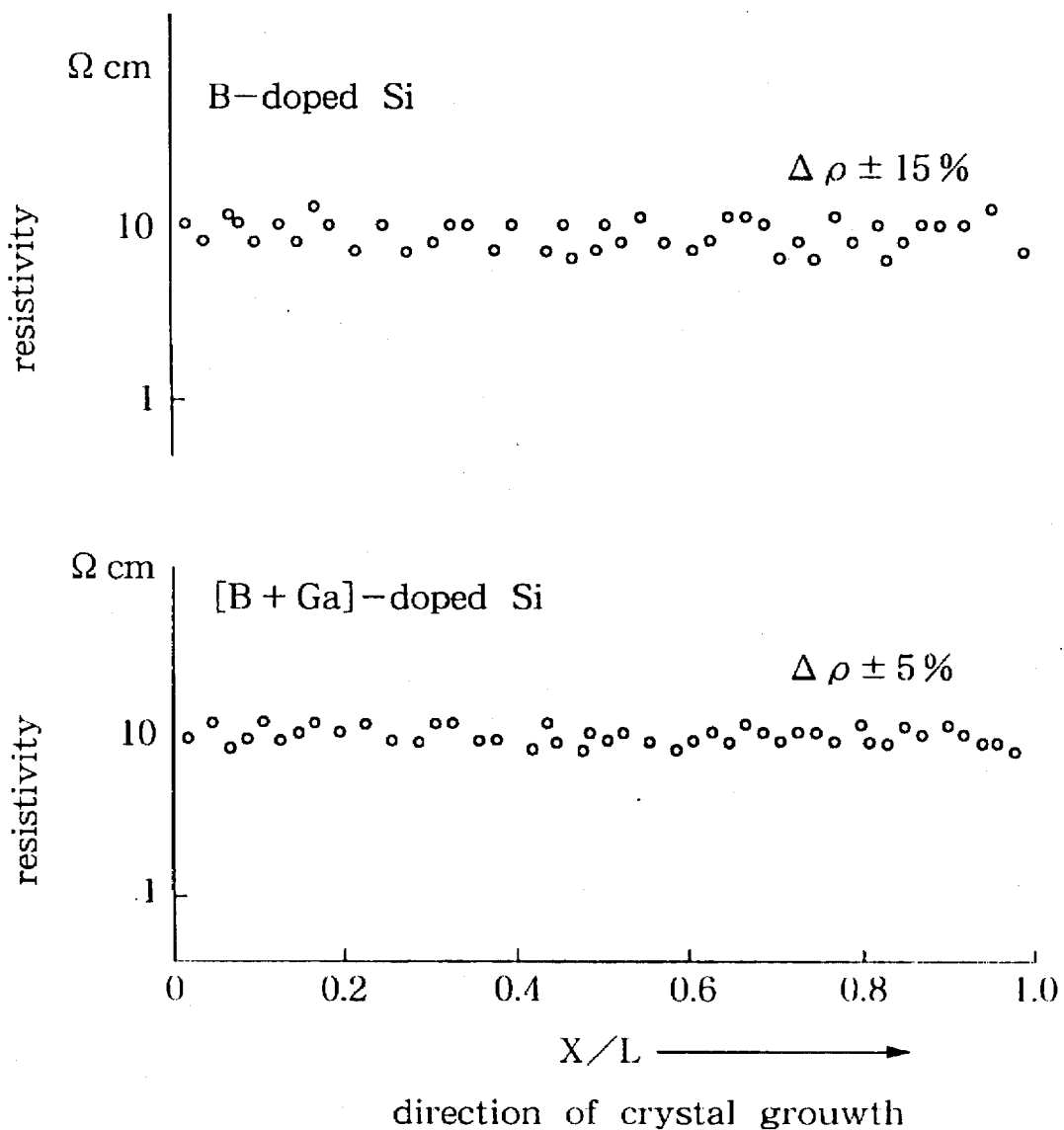
FIG. 3 is a graph showing the deviation of resistivity representing the impurity distribution along the direction of crystal growth in B-doped and B, Ga-doped Si single crystals.

Accounting the effect of the additive to reduce the heat expansion coefficient of the B or P-doped melt, a Si single crystal of 3 inches in diameter and 200 mm in length was pulled up from each of a B-doped Si melt and a B, Ga-doped Si melt. The concentration of impurities was measured along the direction of crystal growth. The results are shown as the deviation of resistivity in FIG. 3. It is noted from FIG. 3 that the the B-doped Si melt without the addition of Ga had resistivity deviated in the range of ±15%, while the B-doped Si melt to which Ga was further added had resistivity deviated in the range of ±5%.

It is apparent from this comparison that a single crystal can be pulled up under the stabilized temperature condition suppressing the local increase of a heat expansion coefficient just below the interface of crystal growth, by adding the element having the effect to reduce the heat expansion coefficient. Consequently, it is recognized that the Si single crystal having the impurity distribution made uniform along the direction of crystal growth.

Example 2

Figure 4:
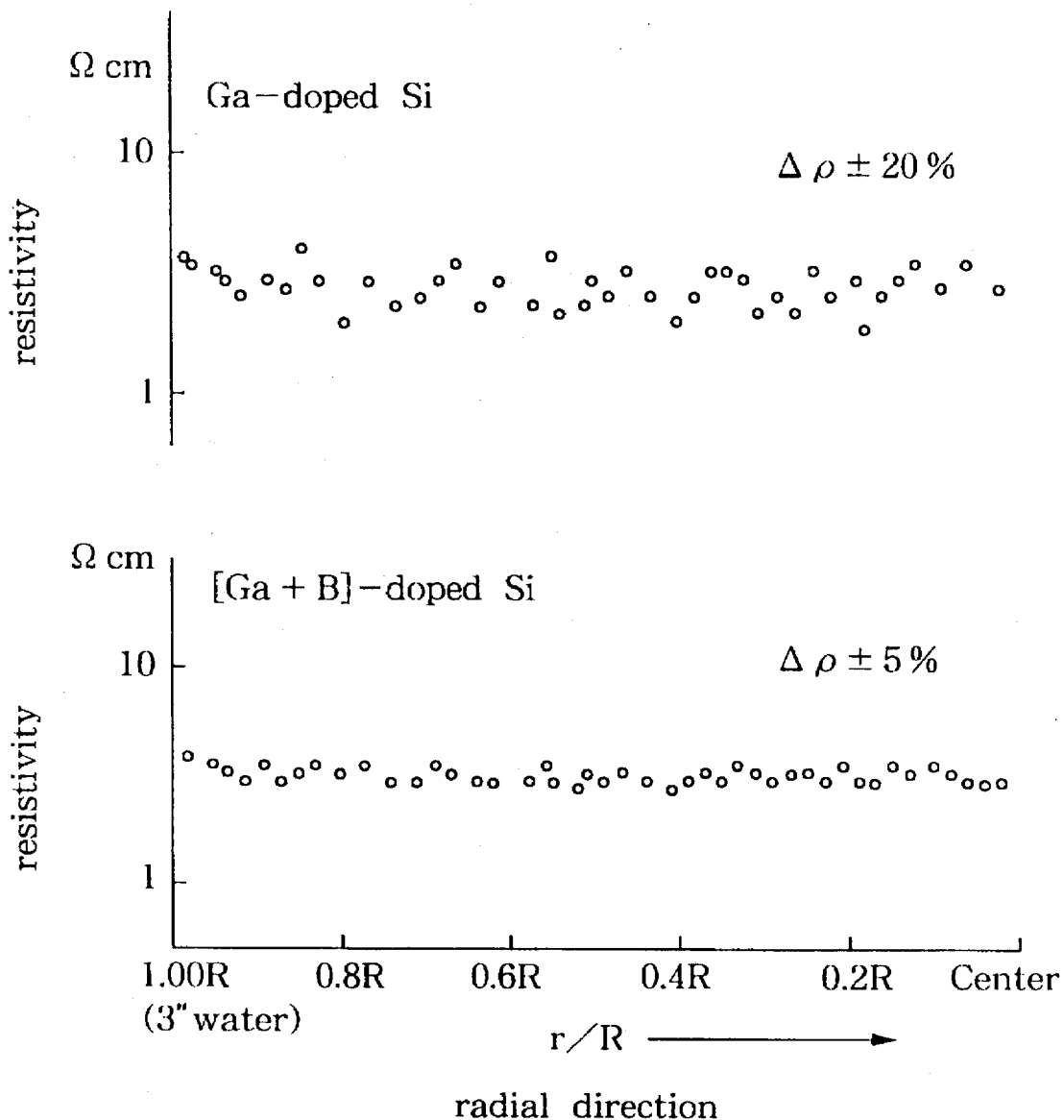
FIG. 4 is a graph showing the deviation of resistivity representing the impurity distribution along the radial direction of Ga and Sb-doped single crystals.

A Si single crystal of 3 inches in diameter and 200 mm in length was pulled up from each of a Ga-doped Si melt and a Ga, B-doped Si melt. The concentration of impurities was measured along the radial direction of the crystal. The results are shown as the deviation of resistivity in FIG. 4. It is noted from FIG. 4 that the the Ga-doped Si melt without the addition of B had resistivity deviated in the range of ±20% along the radial direction, while the B-doped Si melt to which Ga was further added had resistivity deviated in the range of ±5%.

It is apparent from this comparison that the agitation of the melt just below the interface of crystal growth was accelerated by the addition of the element B having the effect to increase the heat expansion coefficient. Consequently, it is recognized that the Si single crystal having the impurity distribution made uniform along the radial direction of the single crystal.

According to the present invention as above-mentioned, the heat expansion of a melt is adjusted by the addition of Ga, Sb or In to a B or P-doped melt or the addition of B or P to a Ga or Sb-doped melt. The element Ga, Sb or In has the effect to reduce the heat expansion coefficent of the melt, so that the B or P-doped Si single crystal can be pulled up under the temperature-stabilized condition controlling the melt flow just below the interface of crystal growth. The single crystal obtained in this way has the impurity distribution made uniform along the direction of crystal growth. While, the element B or P has the effect to increase the heat expansion coefficient of the melt, so that the Ga or Sb-doped Si single can be pulled up under the condition that impurity distribution just below the interface of crystal growth is made uniform. The single crystal obtained in this way has the impurity distribution made uniform along the radial direction.

What is claimed is:

1. A method of pulling up an at least one of B and P-doped Si single crystal from a melt, comprising the steps of:

preparing an at least one of B and P-doped Si melt, adding an element to reduce a heat expansion coefficient of said melt to said melt, and pulling up a Si single crystal from said melt, whereby an impurity distribution of said single crystal is substantially uniform along a direction of crystal growth.

2. The method according to claim 1, wherein the element to reduce the heat expansion coefficient is at least one of Ga, Sb and In.

3. A method of pulling up an at least one of Ga and Sb-doped Si single crystal from a melt, comprising the steps of:

preparing an at least one of Ga and Sb-doped Si melt, adding an element to increase a heat expansion coefficient of said melt to said melt, and pulling up a Si single crystal from said melt, whereby an impurity distribution of said single crystal is made substantially uniform along a radial direction of the crystal.

4. The method according to claim 3, wherein the element to increase the heat expansion coefficient is at least one of B and P.

* * * * *

UNITED STATES PATENT AND TRADEMARK OFFICE
CERTIFICATE OF CORRECTION

PATENT NO. : 5,700,320
DATED : December 23, 1997
INVENTOR(S) : Koji Izunome et al.

It is certified that error appears in the above-identified patent and that said Letters Patent is hereby corrected as shown below:

Column 2 Lines 22-23 after "distribution" delete --uniform--.

Column 3 Line 17 between "When" and "element" insert --an--.

Signed and Sealed this

Twelfth Day of May, 1998

BRUCE LEHMAN

Attest:

Attesting Officer

Commissioner of Patents and Trademarks